United States Patent
Welser et al.

(10) Patent No.: US 7,230,454 B2
(45) Date of Patent: Jun. 12, 2007

(54) SERIAL AUDIO OUTPUT DRIVER CIRCUITS AND METHODS

(75) Inventors: Joseph Jason Welser, Austin, TX (US); Johann Guy Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 115 days.

(21) Appl. No.: 11/060,825

(22) Filed: Feb. 18, 2005

(65) Prior Publication Data

US 2006/0187103 A1   Aug. 24, 2006

(51) Int. Cl.
H03K 19/0175   (2006.01)
(52) U.S. Cl. .......................................... 326/88; 326/83
(58) Field of Classification Search ............. 326/82–92
See application file for complete search history.

(56) References Cited

U.S. PATENT DOCUMENTS

| | | | |
|---|---|---|---|
| 3,946,245 A | 3/1976 | McClaughry | |
| 4,042,838 A | 8/1977 | Street et al. | |
| 4,742,544 A * | 5/1988 | Kupnicki et al. | 380/215 |
| 5,075,571 A | 12/1991 | Dhong et al. | |
| 5,128,560 A | 7/1992 | Chern et al. | |
| 5,694,061 A | 12/1997 | Morosawa et al. | |
| 5,912,575 A * | 6/1999 | Takikawa | 327/157 |
| 6,255,888 B1 | 7/2001 | Satomi | |
| 6,404,273 B1 | 6/2002 | Gregorl et al. | |

* cited by examiner

Primary Examiner—Don Le
(74) Attorney, Agent, or Firm—Thompson & Knight LLP; James J. Murphy

(57) ABSTRACT

An output driver circuit including a transistor for pulling down an output terminal voltage and a charge pump for driving an input of the transistor to pull-down the output terminal voltage substantially to zero volts in response to a selected level of an input signal.

20 Claims, 3 Drawing Sheets

SERIAL AUDIO OUTPUT DRIVER CIRCUITS AND METHODS

FIELD OF INVENTION

The present invention relates in general to mixed signal techniques, and in particular, to serial audio output driver circuits and methods.

BACKGROUND OF INVENTION

Many audio applications, such as audio analog to digital converters (ADCs) and audio encoder—decoders (CO-DECs), utilize a serial data port to transmit digitized audio data to other devices in a system. A typical audio serial data port outputs bits of a serial audio data (SDOUT) stream in response to an associated serial clock (SCLK) signal. In a stereo system, two channels of audio data are time-multiplexed onto the SDOUT stream with a left-right clock (LRCK) signal. Overall timing is controlled by a master clock (MCLK) signal. Advantageously, the utilization of serial ports minimizes the number of pins and associated on-chip driver circuitry.

A typical serial data port operates in either a master mode or a slave mode. In the master mode, the SCLK and LRCK clock signals are generated internally, in response to the received MCLK signal, and output to the destination of the SDOUT stream. In the slave (asynchronous) mode, the SCLK and LRCK clock signals are received from the destination of the SDOUT stream, and therefore may have an arbitrary phase relationships with the SDOUT stream.

In an ADC, the analog input signal is typically sampled on corresponding rising edges of an internal MCLK clock signal, while data are output on the following edges of the SCLK signal. One frequent problem experienced with ADC serial output ports is the coupling of digital noise onto the device substrate from the serial output driver driving the SDOUT output, especially when the SDOUT output is driving a relatively high load. For example, if a bit of the SDOUT stream is output on a falling edge of the SCLK clock signal occurring slightly before the next sample of the analog input is taken with the next rising edge of the MCLK signal, digital noise will couple into the ADC analog circuitry through the chip substrate or metal lines.

In the past, the problem of digital substrate noise generated by the SDOUT output driver has been addressed by re-timing the SCLK clock signal relative to the MCLK clock signal, such that the SDOUT output switching and analog input sampling operations are separated sufficiently in time to prevent digital noise in the substrate from being captured by the analog circuitry. However, in the slave mode, in which the SCLK signal is typically received with an arbitrary phase relationship with the external and/or internal MCLK signals, re-timing is often not possible. In particular, for higher frequency SCLK signals, the timing window between the SCLK signal and the internal MCLK signal may be too small to meet device operating parameters, such as set-up time. In some systems, the SCLK frequency may even exceed that of the internal MCLK signal, essentially excluding the re-timing approach to reducing digital noise coupling on-chip.

Utilizing an un-timed (asynchronous) serial port may be acceptable for DACs and lower-performance or lower-speed ADCs; however, for higher-speed, higher-performance ADCs, the problem of the coupling of digital noise generated by the serial output driver to other circuits on chip must be addressed. Consequently, improved techniques are required for reducing or eliminating digital noise generated by serial output drivers in high-performance applications, such as high-speed ADCs and CODECs. These techniques should be particular advantageous when utilized in devices operating in a slave mode in response to a received high frequency serial clock, although not necessarily limited thereto. Additionally, such techniques should be applicable to any type of mixed analog—digital device in which digital noise must be controlled, and especially to audio ADCs and CODECs.

SUMMARY OF INVENTION

The principles of the present invention are embodied in an output driver circuit including a transistor for pulling down an output terminal voltage and a charge pump for driving a input of the transistor to pull-down the output terminal voltage substantially to zero volts in response to a selected level of an input signal.

Embodiments of the present principles advantageously utilize PMOS output voltage pull-up and pull-down transistors to minimize substrate transmission of noise generated during serial port output switching. These principles are especially advantageous in mixed-signal circuits, although the range of potential applications is much broader. Additionally, gate charge pumping circuitry is disclosed which ensures that the PMOS output pull-down transistors pull-down the output voltage substantially to zero volts. Furthermore, an additional PMOS output pull-down transistor is disclosed which initiates output voltage pull-down operations and thereby minimizes source-to-gate overvoltage across the primary PMOS output pull-down transistors.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
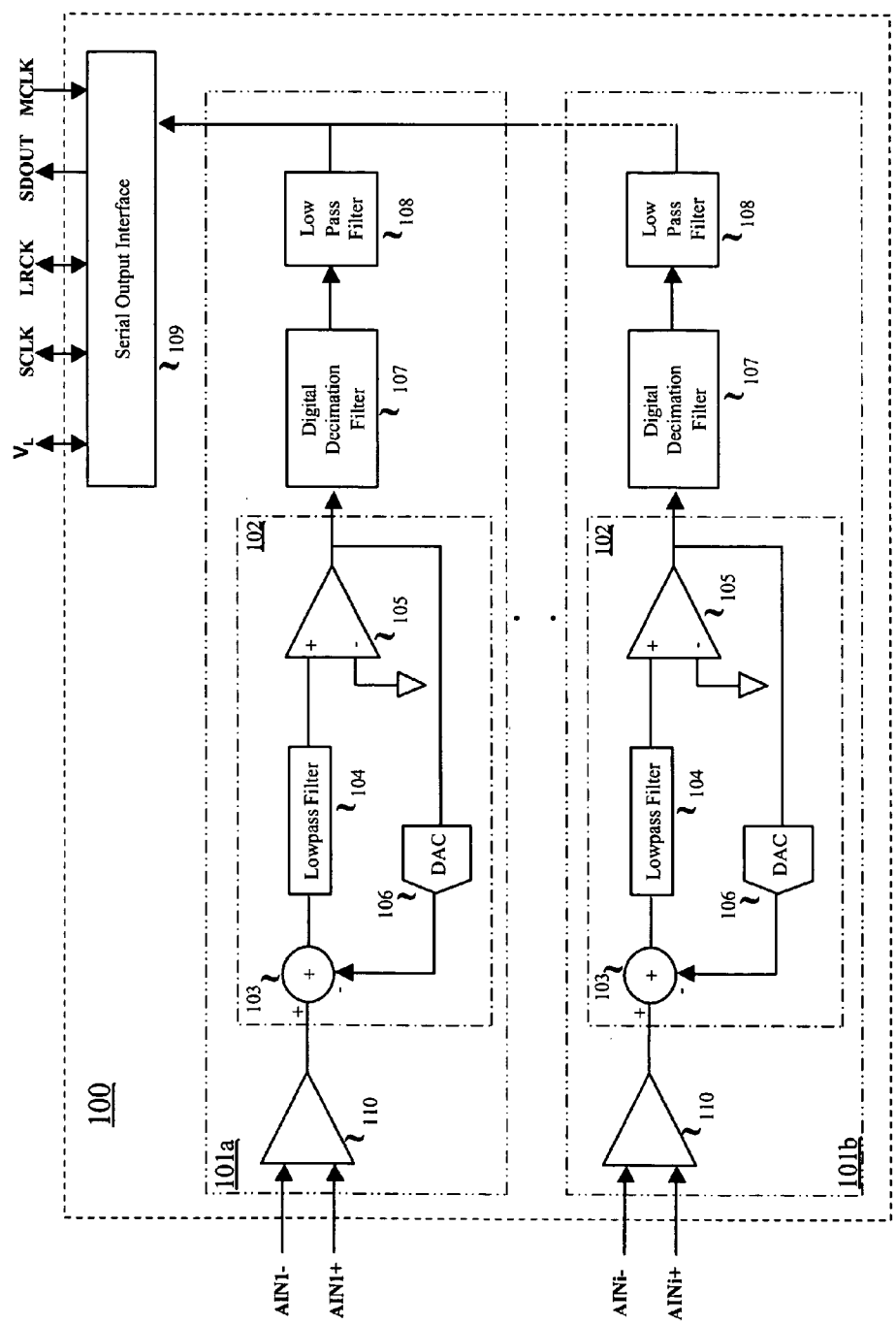
FIG. 1 is a high-level block diagram of an exemplary analog-to-digital converter (ADC) suitable for describing the principles of the present invention.
Figure 2:
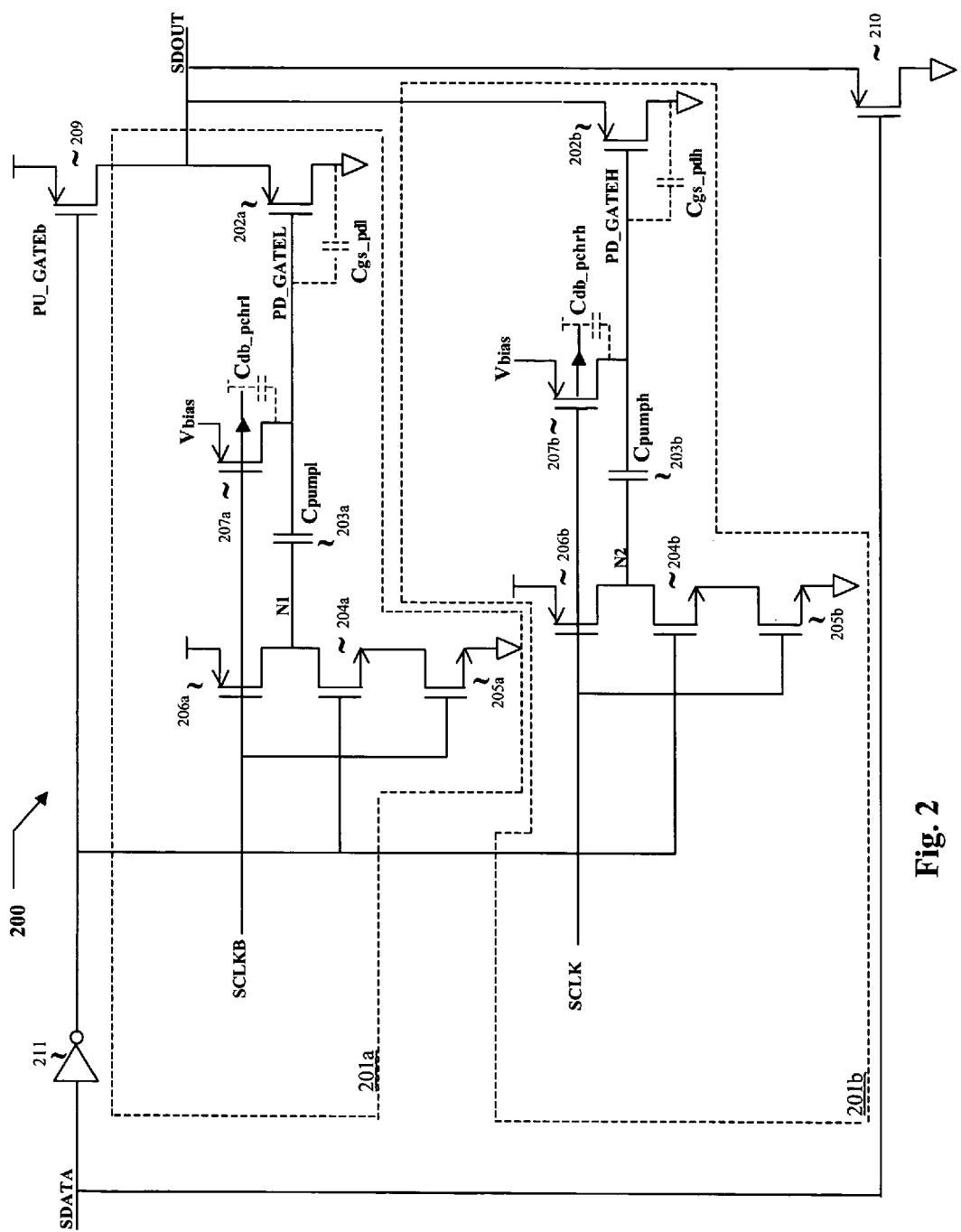
FIG. 2 is an electrical schematic diagram of a representative output driver embodying the principles of the present invention and suitable, in one application, for driving the serial audio output (SDOUT) port shown in FIG. 1.
Figure 3:
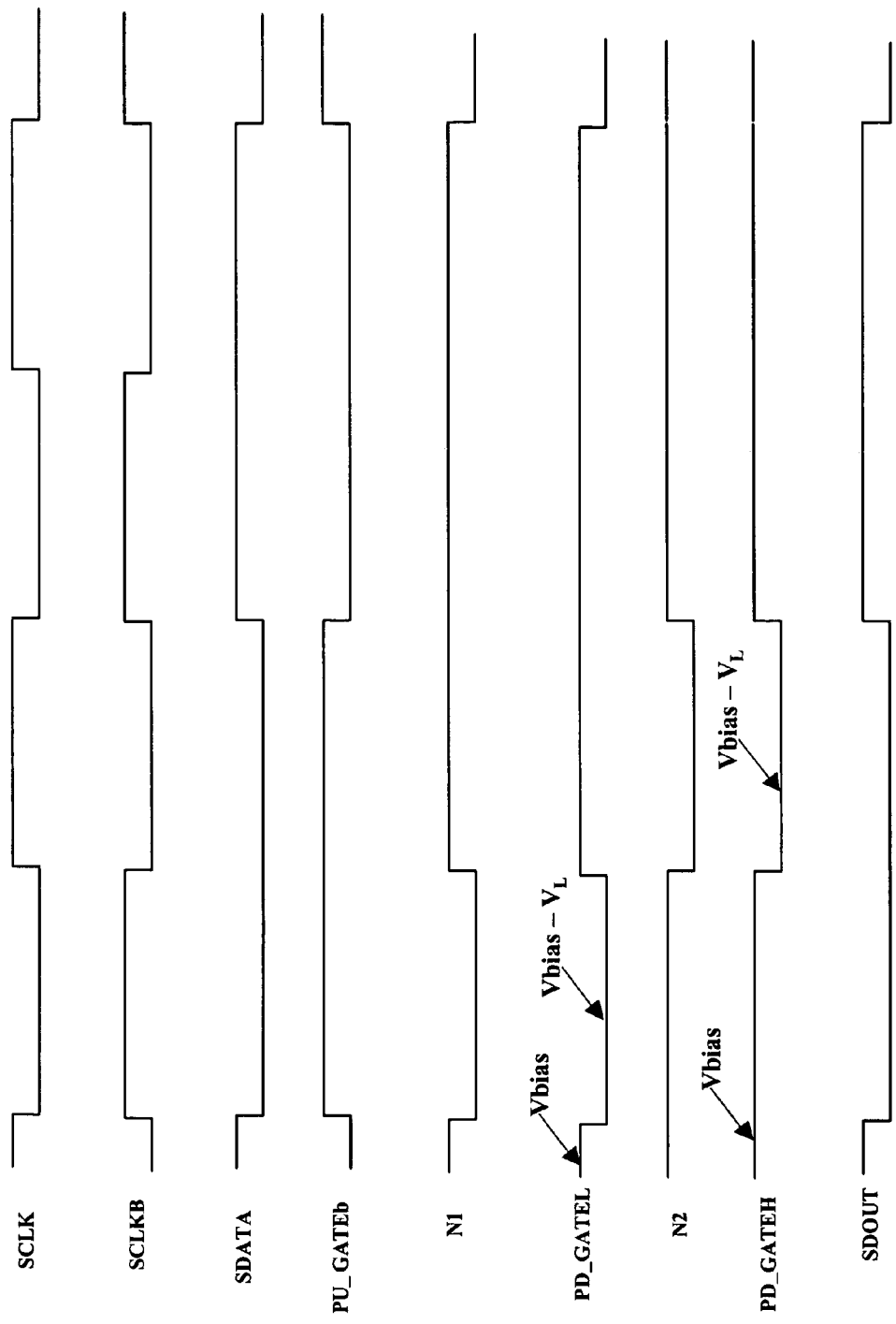
FIG. 3 is a timing diagram illustrating representative operations of the output driver FIG. 2.

The principles of the present invention and their advantages are best understood by referring to the illustrated embodiment depicted in FIGS. 1–3 of the drawings, in which like numbers designate like parts.

FIG. 1 is a high level operational block diagram of a single-chip audio analog-to-digital converter (ADC) 100 suitable for describing the principles of the present invention. ADC 100 is only one of a number of possible applications in which the principles can advantageously be utilized. Other examples include general purpose ADCs, digital to analog converters (DACs), and encoder-decoders (Codecs).

ADC 100 includes n-number of conversion paths, of which 101a and 101b are shown for reference, for converting n-number of channels of analog audio data respectively received at left and right analog differential inputs AINn+/−, where n is the channel number from 1 to n. The analog inputs for each channel in the illustrated embodiment are passed through an input gain stage 110 and then to a delta-sigma modulator 102.

Each delta-sigma modulator 102 is represented in FIG. 1A by a summer 102, low-pass filter 104, comparator (quantizer) 105 and a DAC 106 in the feedback loop. The outputs from the delta-sigma modulators are passed through a decimation filter 107, which reduces the sample rate, and a low pass filter 108.

The resulting digital audio data are output through a single serial port SDOUT of serial output interface 109, timed with a serial clock (SCLK) signal and a left-right clock (LRCK) signal. In the slave mode a, the SCLK and LRCK signals are generated externally and input to converter 100. In the master mode, the SCLK and LRCK signals generated on-chip, along with the associated data, in response to a received master clock MCLK.

Generally, according to the principles of the present invention, PMOS pull-up and pull-down transistors are utilized to drive the SDOUT port of FIG. 1. Advantageously, PMOS pull-up and pull-down transistors are fabricated in a well of n-type semiconductor in a p-type substrate, and are thereby isolated from the remainder of the on-chip circuitry by the n-well to substrate P-N junction. Consequently, noise coupling during switching of these transistors to other circuitry fabricated on the same substrate is substantially reduced or eliminated. Additionally, the principles of the present invention provide voltage boosting to force the gate to source voltage of the PMOS output pull-down transistors more negative relative to the PMOS threshold voltage $V_{TP}$, such that the output voltage at the SDOUT port is pulled-down substantially to ground for logic-low levels of the input signal SDATA.

FIG. 2 is an electrical schematic diagram of a representative output driver 200 embodying the principles of the present invention. In one particular application, output driver 200 is suited to drive the SDOUT port of serial output interface 109 of FIG. 1, although the present inventive principles are not necessarily limited thereto.

In the illustrated embodiment of FIG. 2, output driver 200 includes two symmetrical pull-down circuits 201a and 201b. Pull-down circuit 201a pulls-down the output voltage at the SDOUT port, through PMOS pull-down transistor 202a, when the input data SDATA are in a logic-low state, for logic-low levels of the SCLK signal. Pull-down circuit 201b pulls-down the output voltage at the SDOUT port, through PMOS pull-down transistor 202b, when the input data SDATA are at logic-low, for logic-high levels of the SCLK signal. Together, pull-down circuits 201a and 201b ensure that the output SDOUT never floats when the input data SDATA are in a logic-low state, no matter the current state of the SCLK signal, and even if an external pull-up or pull-down is present on the corresponding SDOUT pin.

Pull-down circuits 201a and 201b operate in precharge and pull-down phases. Generally, during the precharge phase, a corresponding charge-pumping capacitor 203a (Cpumpl) or 203b (Cpumph) is charged to a voltage $V_L-V_{BIAS}$, where $V_L$ is the device power supply voltage and $V_{BIAS}$ is a bias voltage of at most $V_L-V_{TP}$, in which $V_{TP}$ is the threshold voltage of PMOS pull-down transistors 202a and 202b. During the pull-down phase, the input plate of the given charge-pumping capacitor 203a or 203b is forced to ground to pump the opposing capacitor plate and the gate of the corresponding transistor 202a or 202b below ground, and specifically to a voltage of $V_{BIAS}-V_L<-V_{TP}$.

FIG. 3 is a timing diagram illustrating representative operations of output driver 200 in further detail. In this example, when the input data SDATA is in a logic-low state and the SCLK signal is in the logic-high state, pull-down circuit 201a is in the pull-down phase and pull-down circuit 201b is in the precharge phase. In this state, PMOS pull-down transistor 202a pulls-down the output voltage at the SDOUT terminal and PMOS transistor 202b is turned-off. Conversely, for logic-low input data SDATA, when the SCLK signal is in the logic-low state, pull-down circuit 201a is in the pull-down phase and pull-down circuit 201b is in the precharge phase. PMOS pull-down transistor 202a is now turned-off and pull-down transistor 202b pulls-down the output voltage at the SDOUT port.

The precharge and pull-down phases of pull-down circuits 202a and 202b can be illustrated using the operation of pull-down circuitry 201a as an example. The operation of symmetric pull-down circuitry 201b is similar, with only the timing of the precharge and pull-down phases reversed with respects to the phases of the SCLK signal.

Pull-down circuit 201a is in the precharge phase when the input data SDATA is in a logic-low state and the inverse of the SCLK signal, the SCLKB signal, is also in the logic-low state. Consequently, node N1, at the input plate of charge-pumping capacitor 203a (Cpumpl), is pulled to the supply voltage $V_L$, through PMOS transistor 206a. At the same time, node PD_GATEL, at the opposite plate of charge-pumping capacitor 203a, is pulled to the voltage $V_{BIAS}$, through transistor 207a. Capacitor 203a therefore charges to the voltage $V_L-V_{BIAS}$. Node PD_GATEL is a dynamic node that additionally includes the drain-to-bulk capacitance Cdb_pchrl of transistor 207a and the intrinsic gate-to-source capacitance of output pull-down transistor 202a. These capacitances also charge during the precharge phase.

During the pull-down phase, as the SCLKB signal transitions to a logic-high state, NMOS transistors 204a and 205a couple node N1 to ground. Taking into account the parasitic capacitances Cgs_pchrh and Cdb_pchrl shown in FIG. 2, node PD_GATEL is forced below ground to an approximate voltage of:

$$(V_{BIAS}-V_L)*(Cpumpl/(Cpumpl+Cgs\_pdl+Cdb\_pchrl))$$

(i.e. to approximately the voltage $V_{BIAS}-V_L<-V_{TP}$). PMOS output pull-down transistor 202a therefore turns-on hard, pulling the output voltage at the SDOUT terminal down to a logic-low level of substantially zero (0) volts.

An additional PMOS output pull-down transistor 210, having a gate controlled directly by the input data SDATA, is provided to initially pull-down the output voltage at the SDOUT terminal to a lower voltage to reduce the gate to source voltage across PMOS output pull-down transistors 202a and 202b, and thereby reduce stress on PMOS output pull-down transistors 202a and 202b. In particular, PMOS output pull-down transistor 210, which preferably is larger than PMOS output pull-down are transistors 202a and 202b, turns-on slightly before the given one of PMOS output pull-down transistors 202a and 202b turns-on. PMOS output pull-down transistor 210 then pulls-down the output voltage at the SDOUT port from $V_L$ to $V_{TP}$. Hence when either of PMOS output pull-down transistors 202a and 202b turns-on, the maximum gate-to-source voltage applied is $-2V_{TP}$. Without PMOS output pull-down transistor 210, the gate-to-source voltage across PMOS output pull-down transistors 202a and 202b could otherwise be a relatively high voltage of $-(V_{TP}-V_L)=(V_{TP}+V_L)$.

When the data S_DATA are in a logic high state, PMOS output pull-up transistor 209, having a gate PU_GATEb driven by inverter 211, pulls-up the output voltage at the S_DOUT terminal to the voltage supply rail $V_L$. Pull-down circuits 201a and 201b turn-off both output pull-down transistors 202a and 202b in this state.

In sum, according to the principles of the present invention, PMOS output pull-down transistors 202a and 202b and PMOS output pull-up transistor 209 advantageously reduce noise coupling between the voltage switching at the S_DOUT terminal and the remainder of the chip. In turn, pull-down circuits 202a and 202b force the gates of PMOS output pull-down transistors 202a and 202b to below-ground voltage levels, which ensures that the voltage at the S_DOUT terminal is pulled close to ground. PMOS output pull-down transistor 210 ensures that a high source-to-gate voltage does not overstress pull-down transistors 202a and 202b. Advantageously, the S_DOUT terminal never floats, for any logic level of the S_CLK signal.

In alternate embodiments, the principles of the present invention may be applied utilizing double n-well process and NMOS output pull-up and output pull-down transistors to isolate noise generated by a switching serial output from the remainder of the chip. Additionally, the principles of the present invention may be applied to single p—well process, with the corresponding voltages appropriately reversed.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. An output driver circuit comprising:
   a p-type metal oxide semiconductor (PMOS) transistor for controlling an output terminal voltage; and
   a charge pump for driving a gate of the PMOS transistor to pull-down the output terminal voltage to substantially zero volts in response to a voltage level of an input signal.

2. The output driver circuit of claim 1, wherein the charge pump drives the gate of the PMOS transistor below zero volts in response to the selected level of the input signal and a selected level of a clock signal to drive the output terminal voltage to substantially zero volts.

3. The output driver circuit of claim 2, further comprising:
   another PMOS transistor for pulling-down the output terminal voltage; and
   another charge pump for driving a gate of the another PMOS transistor below zero volts to pull-down the output terminal voltage substantially to zero volts in response to the selected level of the input signal and another level of the clock signal.

4. The output driver circuit of claim 1, further comprising another transistor for initially pulling-down the output terminal voltage to reduce a voltage across the transistor in response to the selected level of the input signal.

5. The output driver circuit of claim 1, further comprising another transistor for pulling-up the output terminal voltage in response to another level of the input signal.

6. The output driver circuit of claim 1, wherein the input signal comprises serial audio data.

7. The output driver of claim 2, wherein the clock signal comprises a serial audio clock signal.

8. The output driver of claim 2, wherein the charge pump drives the gate of the PMOS transistor at least one PMOS transistor threshold voltage below zero volts.

9. A method for driving an output terminal comprising:
   selectively pulling-down an output terminal voltage substantially to zero volts with a p-type metal oxide semiconductor (PMOS) transistor in response to a selected level of an input signal with a charge pump driving a gate of the PMOS transistor.

10. The method of claim 9, wherein selectively pulling-down comprises selectively pulling down the output terminal voltage to zero volts with the PMOS transistor in response to the selected level of the input signal and a level of a clock signal.

11. The method of claim 10, further comprises selectively pulling-down the output terminal voltage substantially to zero volts with another PMOS transistor in response to the selected level of the input signal and another level of the clock signal with another charge pump driving a gate of the another PMOS transistor below zero volts.

12. The method of claim 9, further comprising initiating pull-down of the output terminal voltage with another transistor in response to a selected level of an input signal to reduce a voltage across the transistor.

13. The method of claim 10, wherein charge pump drives the gate of the PMOS transistor at least one PMOS threshold voltage below zero volts.

14. The method of claim 9, wherein the input signal comprises serial audio data.

15. The method of claim 10, wherein the clock signal comprises an audio serial clock.

16. An audio integrated circuit comprising:
   a serial audio output driver for minimizing noise transfer from the serial audio output driver to another circuit formed on a substrate with the serial audio output driver, the serial audio output driver comprising:
   a first p-type metal oxide semiconductor (PMOS) transistor for pulling-up an output voltage at an output terminal of the integrated circuit in response to a first level of a serial audio output signal; and
   a second PMOS transistor for pulling-down the output voltage at the output terminal in response to a second level of the serial audio output signal.

17. The audio integrated circuit of claim 16, further comprising circuitry for driving a gate of the second PMOS transistor sufficiently below zero volts such that the second PMOS transistor pulls-down the output voltage substantially to zero volts in response to the second level of the serial audio output signal.

18. The audio integrated circuit of claim 16, wherein the second PMOS transistor pulls-down the output voltage in response to the second level of the signal and a first level of serial clock signal, and the audio integrated circuit further comprises circuitry for maintaining the output terminal in a non-floating state in response to the second level of the serial audio output signal and a second level of the serial clock signal.

19. The audio integrated circuit of claim 18, wherein the circuitry for maintaining the output terminal in a non-floating state comprises a third PMOS transistor for pulling-down the output voltage in response to the second level of the serial audio output signal and the second level of the serial clock signal.

20. The audio integrated circuit of claim 16, further comprising circuitry for minimizing gate to source voltage across the second PMOS transistor.

* * * * *